United States Patent [19]

Charbonnier

[11] 3,805,181

[45] Apr. 16, 1974

[54] FREQUENCY SYNTHESIZER WITH MULTIPLE CONTROL LOOPS

[75] Inventor: Roger Charbonnier, Meudon, France

[73] Assignee: Adret Electronique, Trappes, France

[22] Filed: June 28, 1972

[21] Appl. No.: 267,166

[30] Foreign Application Priority Data

June 29, 1971 France .............................. 71.23658
June 14, 1972 France .............................. 7221527

[52] U.S. Cl. .......................... 331/2, 331/11, 331/14, 331/19

[51] Int. Cl. .............................................. H03b 3/06

[58] Field of Search ....................... 331/2, 11, 19, 14

[56] References Cited

UNITED STATES PATENTS

| | | | |
|---|---|---|---|
| 3,268,831 | 8/1966 | Noordanus et al. | 331/2 |
| 3,479,610 | 11/1969 | Wicker | 331/2 |
| 3,482,181 | 12/1969 | Hawley, Jr. | 331/2 |
| 3,546,617 | 12/1970 | Westwood | 331/2 |

*Primary Examiner*—John Kominski
*Attorney, Agent, or Firm*—William Anthony Drucker

[57] ABSTRACT

Frequency synthesizer capable of generating NP + δ, P being a predetermined step of frequency, N a variable integer and δ a variable increment.

A first oscillator (31) is a slave on to NP and a second oscillator (32) is commanded by the tension of command which enslaves the first, in such a way that its frequency be roughly equal to NP + δ. After this analogical frequency approach, the second oscillator is submitted to a fine subjection by phase-locking technique. The increment δ and the distance between the output frequencies of the two oscillators are divided by a fixed ratio (dividers 54,55) to facilitate the putting into steps of the second oscillator. Application to television synthesizers.

7 Claims, 3 Drawing Figures

FIG. 1

FREQUENCY SYNTHESIZER WITH MULTIPLE CONTROL LOOPS

The present invention refers to the production of electric signals at variable frequency by means of techniques making use of the controlling of the frequency of an oscillator by comparing the said frequency with a standard frequency, the said comparison being effected in a known device called a phase detector or phase comparator.

A known frequency synthesizer comprises a first phase-locking loop with a programmable frequency divider, a second phase-locking loop without a programmable divider and without an analogical frequency approach system, means of inhibiting the second loop while the first effects a numerical approach to the frequency and of inhibiting the first loop and activating the second once this approach is completed, and a third loop which operates at the same time as the second and sets in motion the phase comparator of which it is comprised, this third slave loop comprising also an amplifier for the output voltage of the phase comparator in the second loop, this amplifier being provided for the purpose of adjusting the said output voltage to the value zero.

Such an arrangement permits the generation, without appreciable phase noise, of a frequency PN, P being a predetermined frequency step and N a whole number programmable by means of the divider.

For certain applications it is necessary to generate a frequdncy $F = PN + \delta$, $\delta$ being a frequency increment which may itself comprise a fixed part of $F_o$ and a variable part $\epsilon$, positive or negative.

The known methods of obtaining such a result present considerable difficulties of realisation at high frequencies and are not capable of producing a frequency free from phase noise.

The present invention proposes essentially to generate the frequency PN by a first oscillator suitably controlled and to use the voltage which controls the frequency of this first oscillator to impose on the frequency of a second oscillator a value differing from the first by an amount roughly equal to the increment $\delta$.

Thus a frequency approaching $PN + \delta$ is obtained at the second oscillator, the fine control of the frequency of this second oscillator being achieved by the use of known phase-locking techniques.

In one method of execution of the invention, the first oscillator comprises three control loops, and it is the control voltage of the first frequency approach loop which imposes the approach frequency of the second oscillator, this last comprising a fourth and a fifth loops of the same type as the second and third respectively, the fourth loop serving as the fine control of the frequency of the second oscillator and receiving, for this purpose, the increment $\delta$.

Following a variation, the second oscillator is controlled by a loop comprising a "phase-frequency" digital comparator followed by an integrator circuit.

The various details, as well as the advantages of the invention, will appear clearly with the aid of the description which follows.

Figure 1:
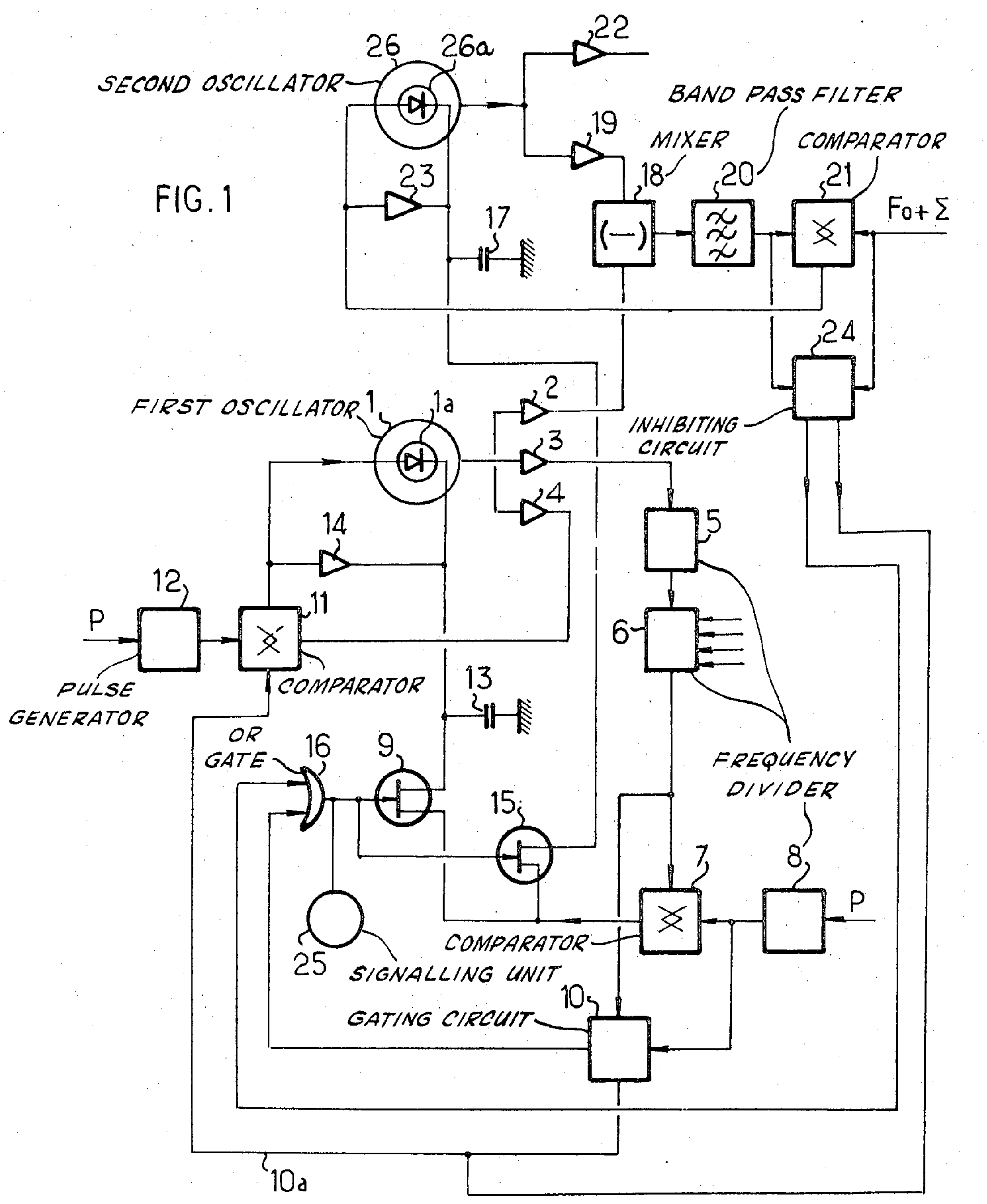
FIG. 1 represents the circuit of a first mode of execution of a frequency synthesizer conforming to the invention.

The synthesizer represented in FIG. 1 comprises a first oscillator 1 whose output frequency is applied to three separator devices 2, 3, 4. These known devices prevent interaction between the different signals.

The separator 3 supplies a first frequency divider 5 with fixed ratio $n$, followed by a divider 6 with ratio N programmable by numerical control.

The output frequency of the divider 6 feeds a first phase comparator 7, which receives from another source a standard frequency P after division in the ratio $n$ by a divider 8.

The output of the comparator 7 controls the frequency of the oscillator 1, for example by acting on the cathode of a variable capacity diode 1*a*. This control is effected through the intermediary of a field effect transistor 9 acting as an interrupter controlled by the output of a first coincidence device 10.

The device 10 is fed by the output signals of the dividers 6 and 8.

A condenser 13 connects the drain of the transistor 9 to earth.

The separator 4 feeds a second phase comparator 11 of the sampling type which receives a spectrum of harmonics of the frequency P in the form of short impulses, supplied by means of an appropriate circuit 12 of a known type.

The output of the comparator 11 is fed to the other electrode (the anode in the example shown) of the variable capacity diode 1*a*.

By way of a variation, the comparators 7 and 11 may act on two distinct variable capacity diodes, or an any other devices controlling the frequency of the oscillator 1.

An amplifier 14 having negative conductance (its output current $I_s = -GE$, G being the gain and E the input voltage) joins the output of the comparator 11 to the cathode of the diode 1*a*.

The part of the circuit which has just been described is known and comprises three controlling loops.

A first loop comprises the dividers 5 and 6 and the comparator 7. This loop is of the known type called "phase-locking." It permits the rapid locking of the oscillator 1 on to the desired frequency, without any risk of locking on to a harmonic of that frequency. This locking is achieved when the frequency $F_1/nN$ issuing from the divider 6 is equal to the frequency $P/n$ issuing from the divider 8, that is to say when $F_1 = PN$.

As long as this first loop is not stabilised, the signal Fhd $1/nN$ not being in phase with the reference impulses $P/n$, the negative peak of the signal $F_1/nN$ coincides at certain instants with the reference impulses. The coincidence circuit 10 is used to activate the field effect transistor 9 during a predetermined time, so that the output signal issuing from the phase comparator 7 is transmitted to the diode 1*a* and the first loop is kept active. At the same time, the second loop comprising the elements 4, 11 and 12 is inhibited (by signals transmitted through the wire 10*a*).

As soon as the first loop is stabilised, the coincidences mentioned above no longer occur and the first loop is inhibited (field effect transistor 9 blocked), while the second is activated.

The first loop introduces a phase noise which is amplified to the level of the oscillator. In fact, the noise introduced by the dividers 5 and 6 and by the frequency $P/n$ is multiplied by the high coefficient Nn in this loop. On the other hand, the second loop is able to operate at very high frequencies without introducing appreciable phase noise. Since this is the loop which is used after stabilization, the circuit is a useful one.

Now the comparator 11, which is normally a symmetric demodulator, converts all amplitude noise into a residual voltage when the loop is in equilibrium, which imposes a relative dephasing between $F_1$ and PN in order that this equilibrium can be achieved. It is in order to suppress this residual noise that a third loop (amplifier 14) is preferably provided.

This third loop does not hinder the functioning of the first (to this effect, the output current of the amplifier 14 is suitably limited). On the other hand, while the second loop is activated, this third loop has the effect of automatically realigning the output voltage of the comparator 11 on to an almost zero value, which practically eliminates the residual noise.

In fact, while the second loop is operating, the transistor 9 being blocked, the condenser 13 retains the potential which it has taken during the operation of the first loop. At the same time, the amplifier 14 applies a positive or negative current to the condenser 13, according as whether the output voltage of the comparator 11 is negative or positive.

The result is that the voltage retained in the condenser 13 is brought back to a value suitable for cancelling the effect of the output voltage of the comparator 11 on the variable capacity diode 1*a*.

The part of the circuit of FIG. 1 which is proper to the invention will now be described, starting with the frequency PN generated by the oscillator 1 and picked up on the output side of the separator 2.

This part of the circuit is intended to generate a frequency $F_2$ which comprises, in addition to the frequency PN variable in steps of height P, a frequency increment $F_{0} + \epsilon$ comprising a variable part $\epsilon$ and, possibly, a fixed part $F_0$.

The simplest known method of obtaining such a frequency consists of applying the frequencies NP and $F_0 + \epsilon$ to a modulator and picking up the subtractive beats.

A method is in fact known of generating $F_0 + \epsilon$ by means of a classical iterative chain of frequency synthesis, and NP by means of a simple phase-locking loop.

However, this simple solution presents serious difficulties. In the first place for the modulator to work under good conditions, the two carrier frequencies corresponding respectively to large variations and to small increments must be at least three times as high as the output frequency $F_2$ which leads to very frequencies for these carriers if the desired frequency $F_2$ is high. The realisation of the programmed counter-dividers for the phase-locking loop is then very difficult; the ratio N having to be very high, the phase noise at the output of the said loop, which is multiplied by N, takes a considerable value.

A subtler known solution consists of inserting, in a classical phase-locking loop, a subtractive mixer situated between the oscillator and the programmed counter-divider and receiving on the one hand the output frequency NP of the oscillator and on the other hand the frequency increment $F_0 + \epsilon$.

This subtractive mixer produces the frequency NP, which, after division by N, is compared with a standard frequency P in the phase comparator of the loop in order to lock the oscillator on to the desired frequency $NP + F_0 + \epsilon$.

However, unless the comparator is very good, it is liable to apply to the oscillator a spectrum of extraneous frequencies of the form $k$P, where $K$ is an integer.

Now the desired oscillator frequency is of the form $(N + N')P + \epsilon$, since $F_0$ is generally chosen to be a multiple of P. When $\epsilon = 0$ the rounded output frequency $(N + N')P$ will coincide with one of the elements of the spectrum $k$P, so that the oscillator will lock on to this element, distant $\epsilon$ from the desired frequency. In actual fact the phenomenon is more complex, and for symmetry reasons two extraneous elements are obtained, distant $\pm\epsilon$ from the desired frequency and straddling it. The extraneous frequencies are practically impossible to eliminate and become more obtrusive as $\epsilon$ gets smaller. (It is in fact known that a frequency modulated oscillator with a modulation frequency $\epsilon$ generates a phase noise corresponding to a dephasing which tends to infinity as $\epsilon$ tends to zero).

The invention proposes to suppress these drawbacks to the known advantages.

It has been stated already that, thanks to the use of a triple control loop, the frequency PN available at the output of the separator 2 is uncontaminated by appreciable phase noise.

According to the invention, a second oscillator 26 is brought into operation, by the part of the circuit described above, at a frequency adjacent to $NP + F_0 + \epsilon$, by the use, during the approach phase, of the control voltage supplied by the first loop to the first oscillator.

It can be seen that the voltage issuing from the phase comparator 7 is applied to one electrode of a variable capacity diode 26*a*, which is contained in the circuit of the oscillator 26, through a field effect transistor 15. This last is activated while the first loop is operative by the signal issued by the circuit 10 and transmitted through an "OR" gate 16. A condenser 17 retains the voltage supplied at that time by the comparator 7.

The circuit of the oscillator 26 is so designed that this voltage, applied to the diode 26*a*, determines an oscillation frequency in the neighbourhood of $NP + F_0 + \epsilon$. It clearly includes, for this purpose, a regulating device (not shown) which allows the increment $\epsilon$ to be varied.

It is clear that this analogical approach to the frequency is not sufficiently precise.

For this reason the output frequencies of the oscillator 26 (transmitted through a separator 19) and of the oscillator 1 (transmitted through the separator 2) are subtracted in a mixer 18.

The resulting beat frequency $F_0 + \epsilon + \Delta$, after filtering in a band-pass filter 20, is applied to a third comparator 21, of the phase comparing type, where it is compared with a frequency $F_0 + \epsilon$, supplied by a classical iterative synthesis chain. The signal, proportional to the phase difference $\Delta$, which is produced by the comparator 21, is applied to the other electrode of the diode 26*a*, thus constituting a fourth control loop in the circuit, which has the effect of cancelling $\Delta$. This fourth loop remains active even when the first is inhibited, since it stabilises itself after the simultaneous frequency approach of the two oscillators has been effected.

The exact frequency $NP + F_0 + \epsilon$ is then collected at the output of a separator 22.

It should be stressed that, the frequency increment $F_0 + \epsilon$ being very much smaller than NP, the filtering of the beat frequency issuing from the mixer 18 presents no difficulty.

Once the approach to the frequency is completed, the second and fourth loops are operating, the first being inhibited.

It is preferable to suppress the residual noise in the fourth loop, as was done for the second, by means of an amplifier 23 with negative conductance in parallel with the variable capacity diode 2*a*. The amplifier 23 functions in the same way as the amplifier 14 and constitutes a fifth control loop.

In the event of the fourth loop ceasing to function correctly, due to a brief interruption of the current or an extraneous voltage, it is advisable to repeat the frequency approach procedure, then to reactivate the first loop and the frequency approach control of the oscillator 26.

For this purpose, a circuit 24 then inhibits the comparator 11, at the same time unblocking the field effect transistors 9 et 15 (by means of the "OR" gate 16). This circuit may consist of a simple frequency comparator or of any device capable of detecting a beat frequency.

A signalling device 25, connected at the output side of the gate 16, indicates whether or not the circuit has reached its stable operating condition.

By way of a numerical example, to generate a frequency $F_2$ between 108 and 118 MHz, one could take for example $F_0 = 20$ MHz and $\epsilon$ variable by increments from 0 to 1 MHz, so that $F_1$ must vary from 88 to 97 MHz. If $n = 10$, the divider 6 must have a ratio programmable between the values 88 and 97, and the standard frequency P defining the step will be 1 MHz.

In general, the variable increment $\epsilon$ determined by the fourth loop can be varied to suit the applications envisaged, either by generating a frequency "offset," i.e. a slight shift, positive or negative, for example of ± 50 KHz, in the case of a television synthesizer, or by covering the whole of a predetermined scale to obtain a synthetizer for general use.

It is worth noting that several oscillators 26, each comprising a fourth and a fifth loops, can be associated with a single circuit comprising the first oscillator and the first three control loops. The frequency approach of each of the oscillators 26 would then be controlled by the comparator 7 as indicated above, but on to different frequencies $PN + F_0' + \epsilon''$, $PN + F_0'' + \epsilon''$, etc.., determined by the properties of their circuits.

This method is particularly interesting in the case of a synthetizer of the "unique lateral band" type, which is required to generate pairs of frequencies.

In another connection, the circuit can be simplified for some applications by omission of certain of the loops, for example those which refine the frequencies of the oscillators (second and fourth loops), or those which reduce the residual voltages (third and fifth loops). The contingency circuit 24 could equally be omitted. However, only the circuit containing the five loops gives a completely satisfactory result in all cases.

Although in the description above $F_2$ has been taken as greater than $F_1$, the reverse case could clearly have been considered.

In order that the circuit of FIG. 1 should work, it is clearly necessary that the analogical approach leads to a frequency difference between the two oscillators which is sufficiently near to the increment, so that the control by the phase-locking loop is possible. This implies that this frequency difference must be less than the band width of the second oscillator. In certain applications this condition carries with it difficulties, or at least complications, in the realisation of the oscillators and of their analogical frequency control.

Figure 2:
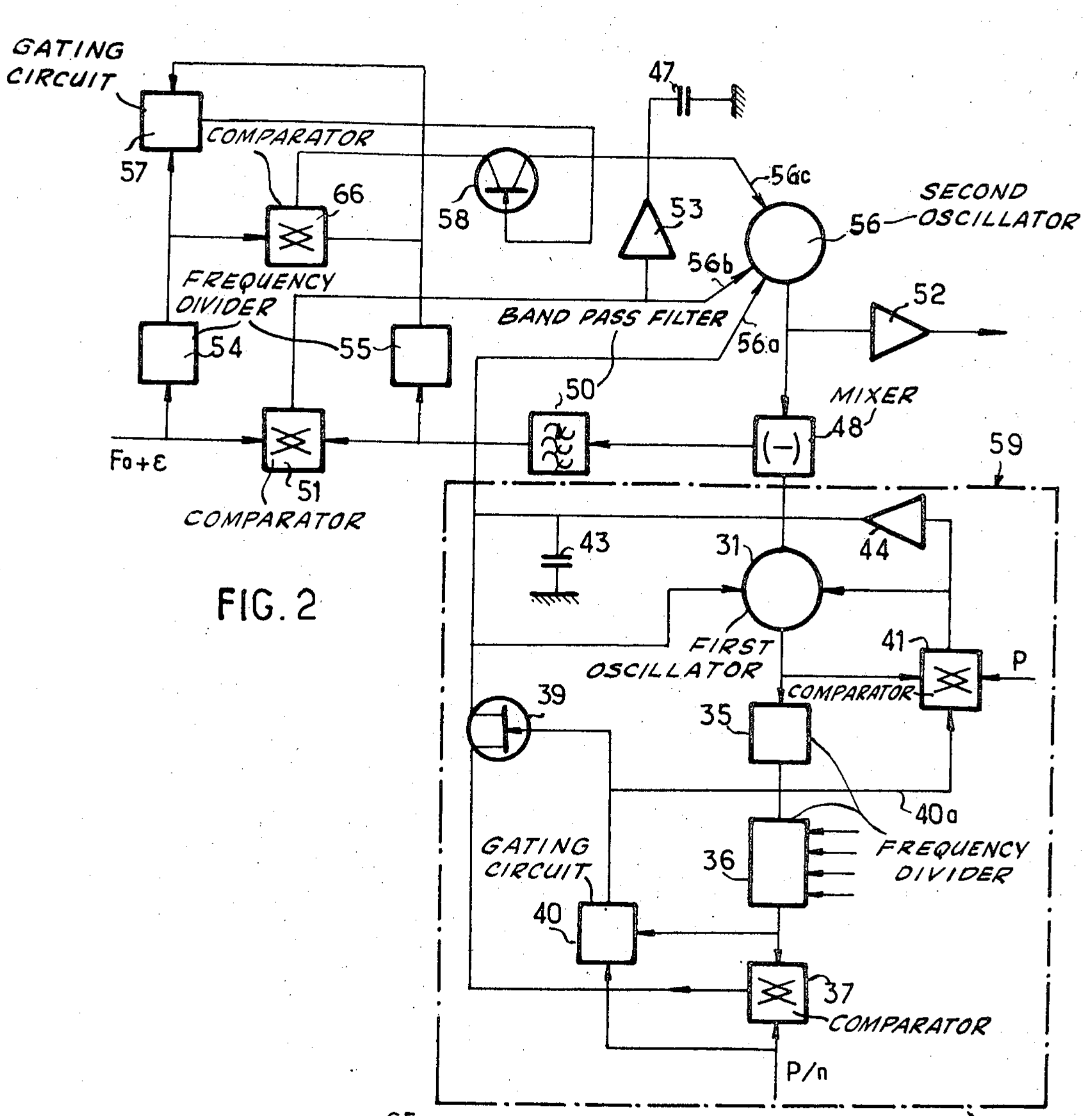
FIG. 2 represents an improved form of execution of the synthesizer of FIG. 1

In the circuit of FIG. 2 these difficulties are overcome by the addition of a supplementary phase-locking loop effecting a complementary approach to the frequency of the second oscillator, this supplementary loop comprising a phase comparator which receives, after division of their frequency, the increment on the one hand and the frequency difference between the two oscillators resulting from the first approach on the other hand, and whose output controls the frequency of the second oscillator.

On FIG. 2, a certain number of the componnets represented in FIG. 1 are shown with their reference numbers augmented by 30 with respect to the corresponding numbers in FIG. 1.

The first oscillator 31 intended to generate the frequency $F_1 = PN$ forms part of a first phase-locking loop comprising a divider 35 with fixed ratio *n* followed by a divider 36 with programmable ratio N and a phase comparator 37 which controls the frequency approach of the oscillator 31 by means of a field effect transistor 39 then active. The comparator 37 receives for this purpose a standard frequency *P*/*n*. The oscillator 31 thus locks rapidly on to the frequency $F_1 = PN$.

A second control loop for the frequency of the oscillator 31 comprises a second phase comparator 41 of the sampling type which receives a spectrum of harmonics of the frequency P.

Finally, a third control loop for the frequency of the oscillator 31 comprises an amplifier 44 with negative conductance and a condenser 43.

During the approach, the signal $F_1/nN$ is not in phase with the reference impulses *P*/*n*, so that coincidences are produced between the negative peaks of the said signals and the said impulses. The circuit 40 is the active. It activates the field effect transistor 39 to set in operation the first loop, while inhibiting the second loop (control 40*a*).

As soon as the first loop is stabilised (or more precisely at the end of a period predetermined by a monostable rocker which forms part of the coincidence circuit 40, this period being fixed at a sufficiently high value that the stabilisation always takes place), the coincidence ceases and the field effect transistor 39 is blocked, so that the first loop is inhibited while the second and the third are activated.

A second oscillator 56 is provided to add the increment. An analogical frequency approach of the oscillator 56 is determined by the command voltage supplied at 56*a* by the first control loop of the oscillator 31.

The resultant frequency $NP + F_0 + \epsilon + \Delta$ is mixed, in a subtractive mixer 48, with the frequency NP of the oscillator 31, and the beat frequency $F_0 + \epsilon + \Delta$ is applied, after filtering in a band-pass filter 50, to a phase comparator 51 where it is compared with a frequency $F_0 + \epsilon$ supplied by a classical iterative synthesis chain. The beat frequency, proportional to the difference in the frequencies (or the voltage proportional to the phase), issuing from the comparator 51, is applied at 56*b* to a frequency control device for the oscillator 56, thus providing a fourth control loop for the frequency of the latter. A fifth loop is comprised, as in FIG. 1, of an amplifier 53 with negative conductance and a condenser 47.

In order that the analogical approach will permit, in every case, the locking-on of the oscillator 56 (taking account of its band-width), the frequencies presented at the two inputs of the phase comparator 51 are divided by a fixed ratio $p$ (dividers 54 and 55), and the resultant frequencies $(F_0 + \epsilon)/p$ and $(F_0 + \epsilon + \Delta)/p$ are compared in a phase comparator 66. The output of the comparator 66, proportional to $\Delta/p$, supplies a supplementary frequency approach to the oscillator 56. It is applied at 56*c* through a field effect transistor 58. This last is controlled by a coincidence circuit 57, itself controlled by the signals issuing from the dividers 65 and 55. If the spread $\Delta$ is relatively small, the fourth loop, 56, 48, 50, 51, 56*b* remains active and stabilises itself. It thus takes in hand, with the fifth integral loop 53, 47, the fine control of the frequency of the oscillator 56. The supplementary approach loop is not used in this case, since no coincidences occur between the signals issuing from the dividers 54 and 55, and the field effect transistor 58 is consequently blocked.

In the case where, on the contrary, the spread $\Delta$ is too great for the fourth loop 56*b* to be able to take on directly the fine control of the oscillator 56 (which could happen for example if the increment is large, or with a change of code in the programmed divider 36), the coincidence circuit 57 unblocks, for a time predetermined by a monostable rocker, the field effect transistor 58, which activates the supplementary approach loop. The latter works on a spread $\Delta/p$, and hence permits the locking of the oscillator 56. Once this locking is achieved the supplementary approach loop is inhibited (58 being blocked) and the fourth and fifth loops come into action as in the case of FIG. 1. This circuit thus permits the realisation of larger increments $F_0 + \epsilon$ than were possible with the circuit of FIG. 1. The output frequency of the circuit is taken off at 52.

Figure 3:
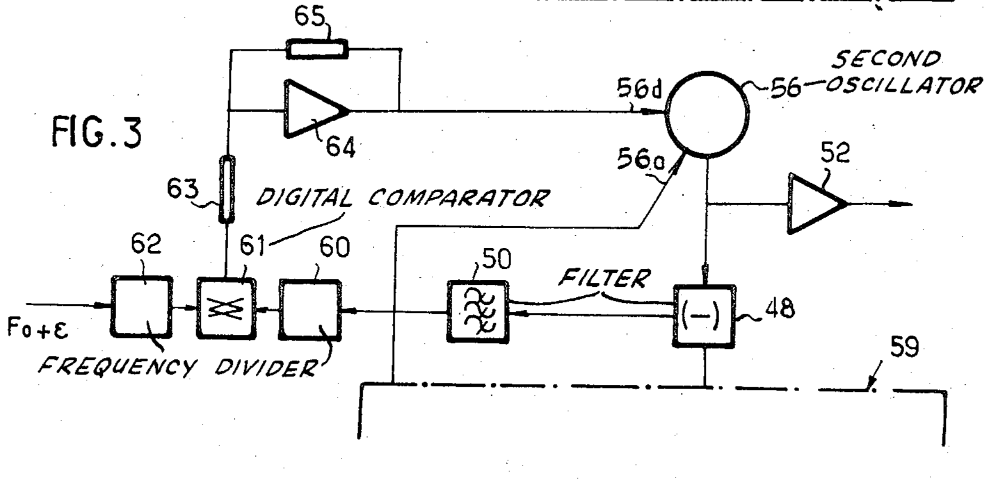
FIG. 3 represents a variation.

In the simplified circuit of FIG. 3, the three control loops of the oscillator 31 are identical with those of FIG. 2: the chain line 59 is intended to represent all the components contained in the rectangle 59 of FIG. 2. The analogical frequency approach of the oscillator 56 is effected in the same way as in the circuit of FIG. 2 (control 56*a*). On the other hand, the loops 56*b* and 56*c* of FIG. 2 are replaced by a single loop comprising the subtractive mixer 48, the filter 50, two fixed frequency dividers 60, 62 (optional) a "phase-frequency" digital comparator 61 and an integrator circuit comprising a resistance 63 and an operational amplifier 64 with an appropriate impedance 65 (of type RC) across its terminals. The supplementary approach loop 56*a* is retained. The "phase-frequency" loop ends at a frequency control entry 56*d* to the oscillator 56. The impedance 65 is chosen so that the control loop thus constituted is of the third or fourth order (at one time proportional and integral).

It is well known that the "phase-frequency" digital comparator supplies an output voltage in saw-tooth form, positive or negative according to the sign of the difference between the two frequencies ($\Delta/p$, $p$ being the ratio of the dividers 60, 62) applied at its terminals. The integration of this saw-tooth voltage by the circuit 64, 65 then gives a continuous positive or negative voltage, proportional $\Delta/p$, and suitable for cancelling $\Delta/p$ by command of the oscillator 56. When the spread $\Delta/p$ is reduced to a simple dephasing, the comparator 61 supplies directly a continuous voltage proportional to this dephasing, whose sign depends on the sense of the dephasing. This voltage, transmitted without modification by the circuit 64, 65, controls the frequency of the oscillator 56 until the dephasing is annulled. The increment is thus introduced into the circuit in a particularly simple and efficacious manner. The circuit functions correctly even for very high values of this increment (greater than the band width of the oscillator). If the increment is relatively small, the dividers 60 and 62 will be omitted.

I claim:

1. A multi-channel generator for producing a stabilized oscillation adjustable in rough and fine frequency steps comprising : a first oscillator having an output signal of a frequency variable in accordance with variations of a first signal applied thereto, a first phase-locking loop for providing said first oscillator with said first signal and including a first programmable frequency divider having an input connected to the output of the first oscillator, a first phase comparator having a first input connected to the output of the said first divider and a second input, means for applying the rough frequency steps to said second input ; a second oscillator having an output signal of a frequency variable in accordance with variations of said first signal and of a second signal applied thereto, a second phase-locking loop for providing said second oscillator with said second signal and including a subtractive mixing unit having a first input connected to the output of the first oscillator and a second input connected to the output of the second oscillator ; a second phase comparator having a first input connected to the output of said mixing unit and a second input, means for applying the fine frequency steps to the second input of the second phase comparator ; and means for applying said first signal to the second oscillator.

2. A multi-channel generator as claimed in claim 1, further comprising : a third phase-locking loop including a third phase comparator having a first input connected to the output of the first oscillator and a second input, means for applying a spectrum of harmonics of the rough frequency step to the second input of the third phase comparator, and means, connected to the output of the third phase comparator, for controlling the frequency variation of the first oscillator ; gating means, having an output, a first input connected to the output of the first frequency divider and a second input connected to the said means for applying the rough frequency steps, and means, connecting the output of said gating means to the first oscillator and to the third phase comparator for inhibiting the application of the first signal to the first oscillator while activating the third phase comparator, as soon as the first oscillator is stabilized.

3. A multi-channel generator as claimed in claim 1, wherein the first and second oscillators each have first and second frequency control inputs, the first control input of the first oscillator being connected to the output of the third phase comparator, the second control input of the first oscillator being connected to the output of the first phase comparator, the first control input of the second oscillator being connected to the output of the second phase comparator, the second control input of the second oscillator being connected to the output of the first phase comparator, first and second amplifiers being respectively connected between the first and second control inputs of the first and second oscillators and first and second condensers respectively connecting the second control inputs of the first and second oscillators to the earth.

4. A multi-channel generator as claimed in claim 3, further comprising first and second fixed ratio frequency dividers having inputs respectively connected at the first and second inputs of the second phase comparator and a fourth phase comparator having first and second inputs respectively connected to the outputs of the first and second fixed ratio frequency dividers, the output of said fourth phase comparator being connected to a third frequency control input of the second oscillator.

5. A multi-channel generator as claimed in claim 1, wherein the second phase comparator is a phase-frequency digital comparator, the output of which is connected to the second oscillator through an integrator circuit.

6. A multi-channel generator according to claim 2, wherein the said inhibiting means comprise a field effect transistor mounted as an interrupter, connecting the output of the first phase comparator to a frequency control input of the first oscillator, said field effect transistor having a control electrode connected to the output of said gating means.

7. A multi-channel generator according to claim 6, further comprising means for detecting the presence of a beat frequency across the first and second inputs of the second phase comparator, and means for connecting the output of said detecting means to the said control electrode, for activating the first loop in the absence of such a beat frequency.

* * * * *